United States Patent
Gerard et al.

(10) Patent No.: US 9,634,619 B2
(45) Date of Patent: Apr. 25, 2017

(54) POWER AMPLIFIER BIAS CIRCUIT HAVING PARALLEL EMITTER FOLLOWER

(71) Applicant: SKYWORKS SOLUTIONS, INC., Woburn, MA (US)

(72) Inventors: Michael Lynn Gerard, Cedar Rapids, IA (US); Ramanan Bairavasubramanian, Hiawatha, IA (US); Dwayne Allen Rowland, Mayodan, NC (US); Matthew Lee Banowetz, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 30 days.

(21) Appl. No.: 14/531,967

(22) Filed: Nov. 3, 2014

(65) Prior Publication Data

US 2015/0349715 A1     Dec. 3, 2015

Related U.S. Application Data

(60) Provisional application No. 62/004,141, filed on May 28, 2014.

(51) Int. Cl.
| | | |
|---|---|---|
| *H03F 3/04* | (2006.01) | |
| *H03F 3/19* | (2006.01) | |
| *H03F 1/56* | (2006.01) | |
| *H03F 1/02* | (2006.01) | |
| *H03F 1/32* | (2006.01) | |
| *H03F 3/24* | (2006.01) | |

(52) U.S. Cl.
CPC ............. *H03F 3/19* (2013.01); *H03F 1/0261* (2013.01); *H03F 1/32* (2013.01); *H03F 1/56* (2013.01); *H03F 3/245* (2013.01); *H03F 2200/18* (2013.01); *H03F 2200/222* (2013.01); *H03F 2200/387* (2013.01); *H03F 2200/451* (2013.01); *H03F 2200/555* (2013.01)

(58) Field of Classification Search
CPC ........................................ H03F 1/302
USPC ................. 330/296, 285, 289, 307
See application file for complete search history.

(56) References Cited

U.S. PATENT DOCUMENTS 6,977,551 B2 * 12/2005 Ichitsubo ................ H01L 23/66
                                                                              330/129
7,009,453 B2 * 3/2006 Kuriyama ............. H03F 1/0261
                                                                              330/289

\* cited by examiner

*Primary Examiner* — Khanh V Nguyen
*Assistant Examiner* — Khiem Nguyen
(74) *Attorney, Agent, or Firm* — Chang & Hale LLP

(57) ABSTRACT

Improved power amplifier (PA) bias circuit having parallel emitter follower. In some embodiments, a bias circuit for a PA can include a first bias path implemented to couple a base node of an amplifying transistor and a supply node, with the first bias path being configured to provide a base bias current to the base node. The PA can further include a second bias path implemented to be electrically parallel with the first bias path between the base node and the supply node. The second bias path can be configured to provide an additional base bias current to the base node under a selected condition.

18 Claims, 5 Drawing Sheets

POWER AMPLIFIER BIAS CIRCUIT HAVING PARALLEL EMITTER FOLLOWER

CROSS-REFERENCE TO RELATED APPLICATION(S)

This application claims priority to U.S. Provisional Application No. 62/004,141 filed May 28, 2014, entitled CIRCUITS AND METHODS RELATED TO POWER AMPLIFIER BIAS CIRCUITS HAVING PARALLEL EMITTER FOLLOWERS, the disclosure of which is hereby expressly incorporated by reference herein in its entirety.

BACKGROUND

Field

The present disclosure generally relates to power amplifiers having parallel emitter followers.

Description of the Related Art

In many radio-frequency (RF) applications, a power amplifier (PA) typically includes an amplifying transistor such as a heterojunction bipolar transistor (HBT). In input RF signal can be provided to the base of such a transistor, and the amplified RF signal can be output through the collector of the transistor. Supply voltage for the transistor can be provided to the collector, and a bias signal can be provided to the base. Such a bias signal is typically provided by a bias circuit.

SUMMARY

In some implementations, the present disclosure relates to a bias circuit for a power amplifier (PA). The bias circuit includes a first bias path implemented to couple a base node of an amplifying transistor and a supply node, with the first bias path being configured to provide a base bias current to the base node. The bias circuit further includes a second bias path implemented to be electrically parallel with the first bias path between the base node and the supply node. The second bias path is configured to provide an additional base bias current to the base node under a selected condition.

In some embodiments, the amplifying transistor can be part of a driver stage of the PA. In some embodiments, the second bias path can include an emitter follower having a collector, an emitter, and a base. The collector can be coupled to the supply node, and the emitter can be coupled to the base node. The base of the emitter follower can be coupled to a node having a DC voltage. The emitter follower can be configured so that its average emitter voltage increases with an increase in RF power at an RF input node. The emitter follower can be further configured to conduct at the condition to thereby provide the additional base bias current to the base node. The selected condition can include a selected level of increased RF power at the input node. The selected level of increased RF power resulting in the conduction through the emitter follower can result in a reversal of gain and phase droop associated with the driver stage. The DC voltage can be selected such that the reversal of gain and phase droop of the driver stage substantially coincides with a final stage compression. The DC voltage can be selected such that the emitter follower is biased just below a turn-on level with a selected low RF power at the input node.

In some embodiments, the second bias path can further include a resistance between the emitter of the emitter follower and the base node. In some embodiments, the bias circuit can further include a capacitance that couples the emitter of the emitter follower and the input node.

In some embodiments, the first bias path can include a field-effect transistor (FET) having a source, a drain, and a gate, with the source coupled to the supply node, and the drain coupled to the base node. The first bias path can further include a resistance between the drain of the FET and the base node. The first bias path can be part of a current mirror. The current mirror can include a reference side coupled to the first bias path. The reference side can include a bipolar-junction transistor (BJT) having a collector, an emitter, and a base, with the collector coupled to a reference current node, and the emitter coupled to a ground. The reference current node can be coupled to the gate of the FET of the first bias path, and the base of the BJT of the reference side can be coupled to a node between the source of the FET and the resistance of the first bias path. In some embodiments, each of the BJT of the reference side of the current mirror, the emitter follower of the second bias path, and the amplifying transistor can be a heterojunction bipolar transistor (HBT).

According to a number of implementations, the present disclosure relates to a method for biasing a power amplifier (PA). The method includes providing a base bias current to a base node of an amplifying transistor through a first bias path that couples the base node and a supply node. The method further includes generating an additional base bias current under a selected condition. The method further includes delivering the additional base bias current to the base node through a second bias path that is electrically parallel with the first bias path between the base node and the supply node.

In some teachings, the present disclosure relates to a power amplifier (PA) system that includes a PA circuit having an amplifying transistor. The amplifying transistor includes a base, a collector, and an emitter, with the base coupled to a base node for receiving a radio-frequency (RF) signal. The PA system further includes a bias circuit implemented to bias the base of the amplifying transistor. The bias circuit includes a first bias path configured to couple the base node and a supply node. The first bias path is further configured to provide a base bias current to the base node. The bias circuit further includes a second bias path configured to be electrically parallel with the first bias path between the base node and the supply node. The second bias path is further configured to provide an additional base bias current to the base node under a selected condition.

According to a number of implementations, the present disclosure relates to a power amplifier (PA) die that includes a semiconductor substrate and a PA circuit implemented on the semiconductor substrate. The PA circuit includes an amplifying transistor having a base, a collector, and an emitter. The base is coupled to a base node for receiving a radio-frequency (RF) signal. The PA circuit further includes a bias circuit implemented on the semiconductor substrate. The bias circuit is configured to bias the base of the amplifying transistor. The bias circuit includes a first bias path configured to couple the base node and a supply node. The first bias path is further configured to provide a base bias current to the base node. The bias circuit further includes a second bias path configured to be electrically parallel with the first bias path between the base node and the supply node. The second bias path is further configured to provide an additional base bias current to the base node under a selected condition.

In some implementations, the present disclosure relates to a power amplifier module that includes a packaging substrate configured to receive a plurality of components, and a power amplifier (PA) circuit formed on a die that is mounted on the packaging substrate. The PA circuit includes an amplifying transistor having a base, a collector, and an emitter, with the base coupled to a base node for receiving a radio-frequency (RF) signal. The module further includes a bias circuit coupled with the PA circuit and configured to bias the base of the amplifying transistor. The bias circuit includes a first bias path configured to couple the base node and a supply node. The first bias path is further configured to provide a base bias current to the base node. The bias circuit further includes a second bias path configured to be electrically parallel with the first bias path between the base node and the supply node. The second bias path is further configured to provide an additional base bias current to the base node under a selected condition. The module further includes a plurality of connectors configured to provide electrical connections between the PA circuit, the bias circuit, and the packaging substrate.

In a number of implementations, the present disclosure relates to a wireless device that includes a transceiver configured to generate a radio-frequency (RF) signal, and a power amplifier (PA) module in communication with the transceiver and configured to amplify the RF signal. The PA module includes a PA circuit having an amplifying transistor. The amplifying transistor includes a base, a collector, and an emitter, with the base coupled to a base node for receiving a radio-frequency (RF) signal. The PA module further includes a bias circuit coupled with the PA circuit and configured to bias the base of the amplifying transistor. The bias circuit includes a first bias path configured to couple the base node and a supply node. The first bias path is further configured to provide a base bias current to the base node. The bias circuit further includes a second bias path configured to be electrically parallel with the first bias path between the base node and the supply node. The second bias path is further configured to provide an additional base bias current to the base node under a selected condition. The wireless device further includes an antenna in communication with the PA module. The antenna is configured to facilitate transmission of the amplified RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
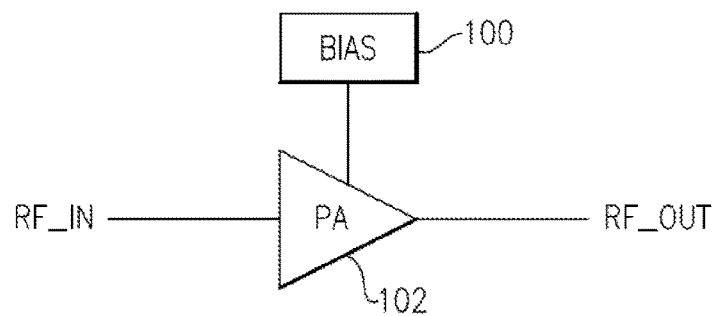
FIG. 1 depicts a power amplifier (PA) system having a PA coupled to a bias circuit.

Described herein are non-limiting examples of how a power amplifier (PA) can be biased to yield desirable features such as improved linearity. FIG. 1 schematically depicts a PA system having a PA 102 coupled to a bias circuit 100. Examples related to the bias circuit 100 are described herein in greater detail. The PA 102 is shown to receive a radio-frequency (RF) signal (RF_IN) and generate an amplified RF signal (RF_OUT).

Figure 2:
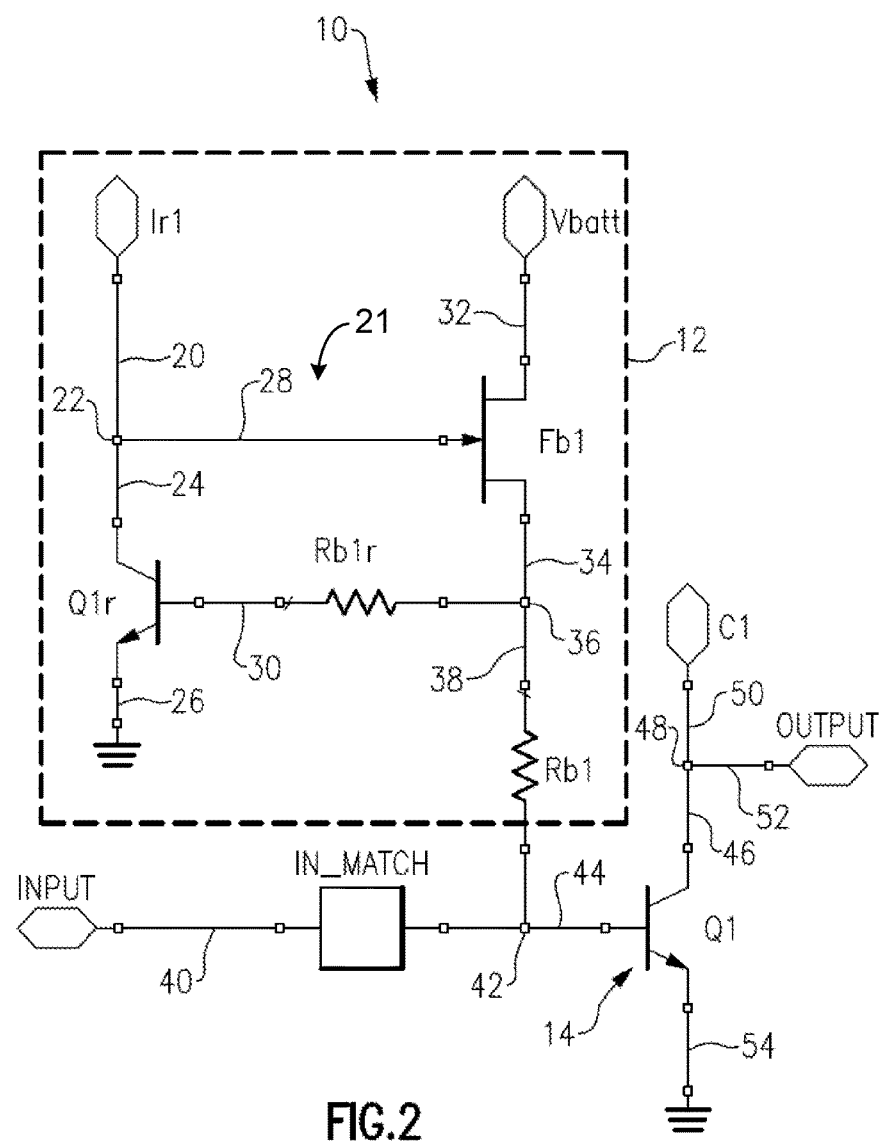
FIG. 2 shows an example of a typical biasing configuration that includes a bias circuit coupled to a PA stage.

FIG. 2 shows an example of a typical biasing configuration 10 that includes a bias circuit 12 coupled to a PA stage 14. For the purpose of description, such a PA stage can be, for example, a driver stage. The PA stage 14 can include an amplifying transistor Q1 such as a heterojunction bipolar transistor (HBT). It will be understood that one or more features of the present disclosure can also be implemented for other types of amplifying transistors. It will also be understood that one or more features of the present disclosure can also be implemented for PA stage(s) other than a driver stage.

The base of the transistor Q1 is shown to receive an input RF signal through an input port (Input), path 40, an input matching network (In_match), node 42, and path 44. The amplified RF signal is shown to be provided to an output port (Output) through the collector of the transistor Q1, path 46, node 48, and path 52. Supply voltage for the transistor Q1 can be provided to the collector of Q1 from a supply node (C1), through path 50, node 48, and path 46. The emitter of the transistor Q1 is shown to be coupled to ground through path 54.

Bias signal for the amplifying transistor Q1 is shown to be provided by the bias circuit 12 to the base node 42. Such a bias signal can be a bias current resulting from a current mirror arrangement 21 between a reference side and a battery supply side. The reference side is shown to include a path between a reference current node (Ir1) and ground through path 20, node 22, path 24, a bipolar junction transistor (Q1r) (BJT such as an HBT), and path 26. The battery supply side is shown to include a path between a battery voltage node (Vbatt) and the node 42 through path 32, a field-effect transistor (Fb1), path 34, node 36, path 38, and a base resistance Rb1. The gate of the FET Fb1 is shown to be coupled to the collector node 22 of Q1r through path 28. The base of the HBT Q1r is shown to be coupled to the source node 36 of Fb1 through path 30 that includes a resistance Rb1r.

In the example of FIG. 2, an average or DC voltage at the source of Fb1 varies little with RF input power. Accordingly, the bias circuit 12 is generally unable to vary the bias current supplied to the amplifying transistor Q1 when power of the RF signal changes.

Figure 3:
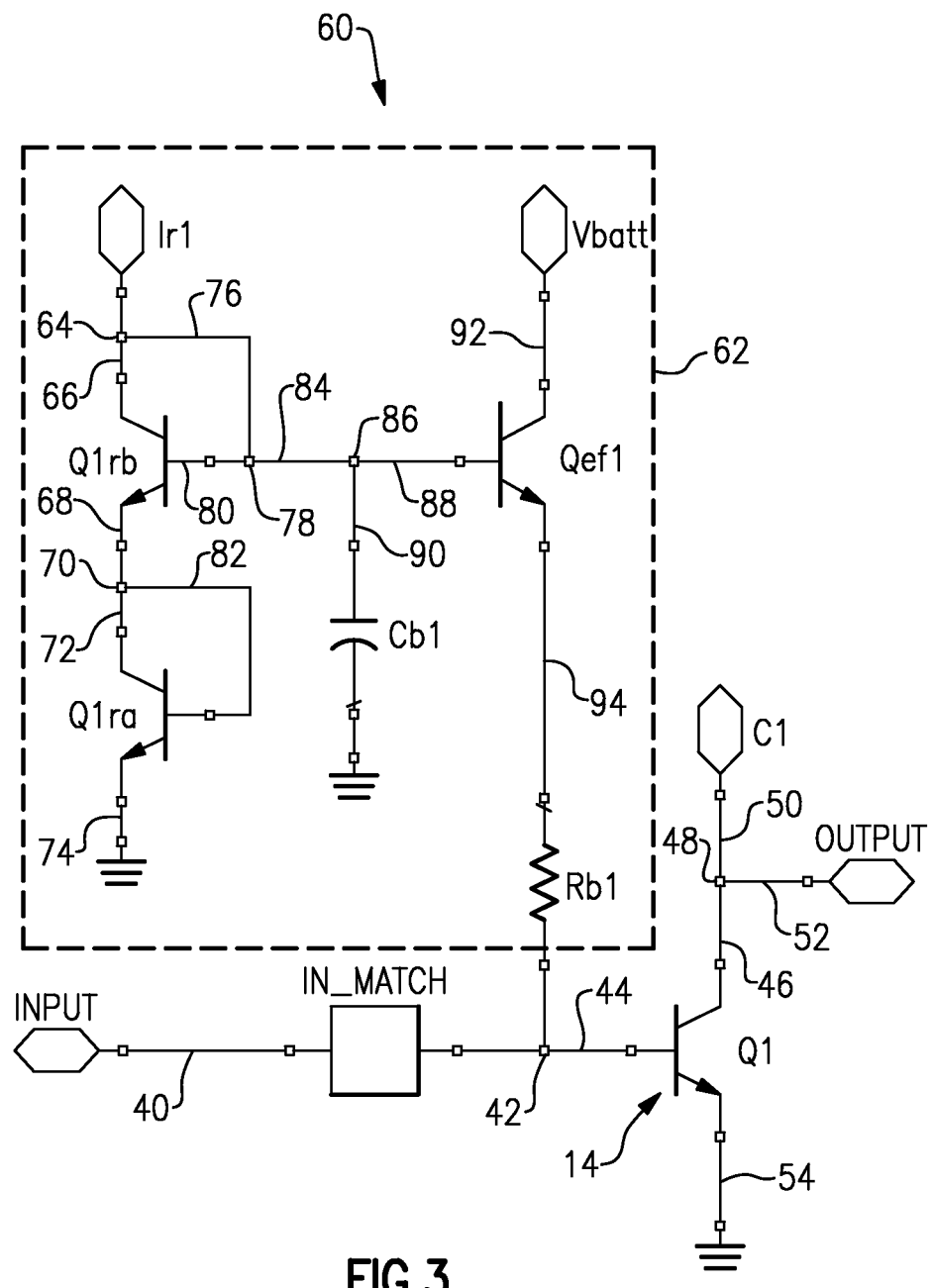
FIG. 3 shows an example of a biasing configuration where a bias circuit can provide varying biasing signal to an amplifying transistor, depending on the power associated with a radio-frequency (RF) signal.

FIG. 3 shows an example of a biasing configuration 60 where a bias circuit 62 can provide varying biasing signal to an amplifying transistor Q1, depending on the power associated with an RF signal. Such an RF signal is shown to be received by the base of Q1 through an input port (Input), path 40, an input matching network (In_match), node 42, and path 44. The amplified RF signal is shown to be provided to an output port (Output) through the collector of the transistor Q1, path 46, node 48, and path 52. Supply voltage for the transistor Q1 can be provided to the collector node 48 of Q1 from a supply node (C1), through path 50. The emitter of the transistor Q1 is shown to be coupled to ground through path 54.

Bias signal for the amplifying transistor Q1 is shown to be provided by the bias circuit 62 to the base node 42. Such a bias signal can be a bias current resulting from a current mirror arrangement between a reference side and a battery supply side. The reference side is shown to include a path between a reference current node (Ir1) and ground through node 64, path 66, a first BJT (Q1rb) (e.g., an HBT), path 68, node 70, path 72, a second BJT (Q1ra) (e.g., an HBT), and path 74. The battery supply side is shown to include a path between a battery voltage node (Vbatt) and the base node 42 through path 92, a third BJT (Qef1) (e.g., an HBT), path 94, and a base resistance Rb1.

In the example of FIG. 3, the collector and base of the first HBT Q1rb are shown to be coupled through path 76 such that Q1rb functions as a first diode D1. Similarly, the collector and base of the second HBT Q1ra are shown to be coupled through path 82 such that Q1ra functions as a second diode D2.

In the example of FIG. 3, the base of Q1rb and the base of Qef1 are shown to be coupled by a path that includes path 80, node 78, path 84, node 86, and path 88. The node 86 between the bases of Q1rb and Qef1 is shown to be coupled to ground through path 90 and a capacitance Cb1.

The foregoing example described in reference to FIG. 3 is a typical emitter follower bias linearizing circuit. In such a linearizing circuit, average or DC voltage at the emitter of Qef1 can vary with variation in RF input power, thereby resulting in some linearity enhancement. However, it is noted that typical emitter follower linearizing circuits, such as the example of FIG. 3, generally provide beneficial result at or near maximum average power associated with RF signals. Such typical emitter follower designs can also be sensitive to parasitic RF coupling effects.

Figure 4:
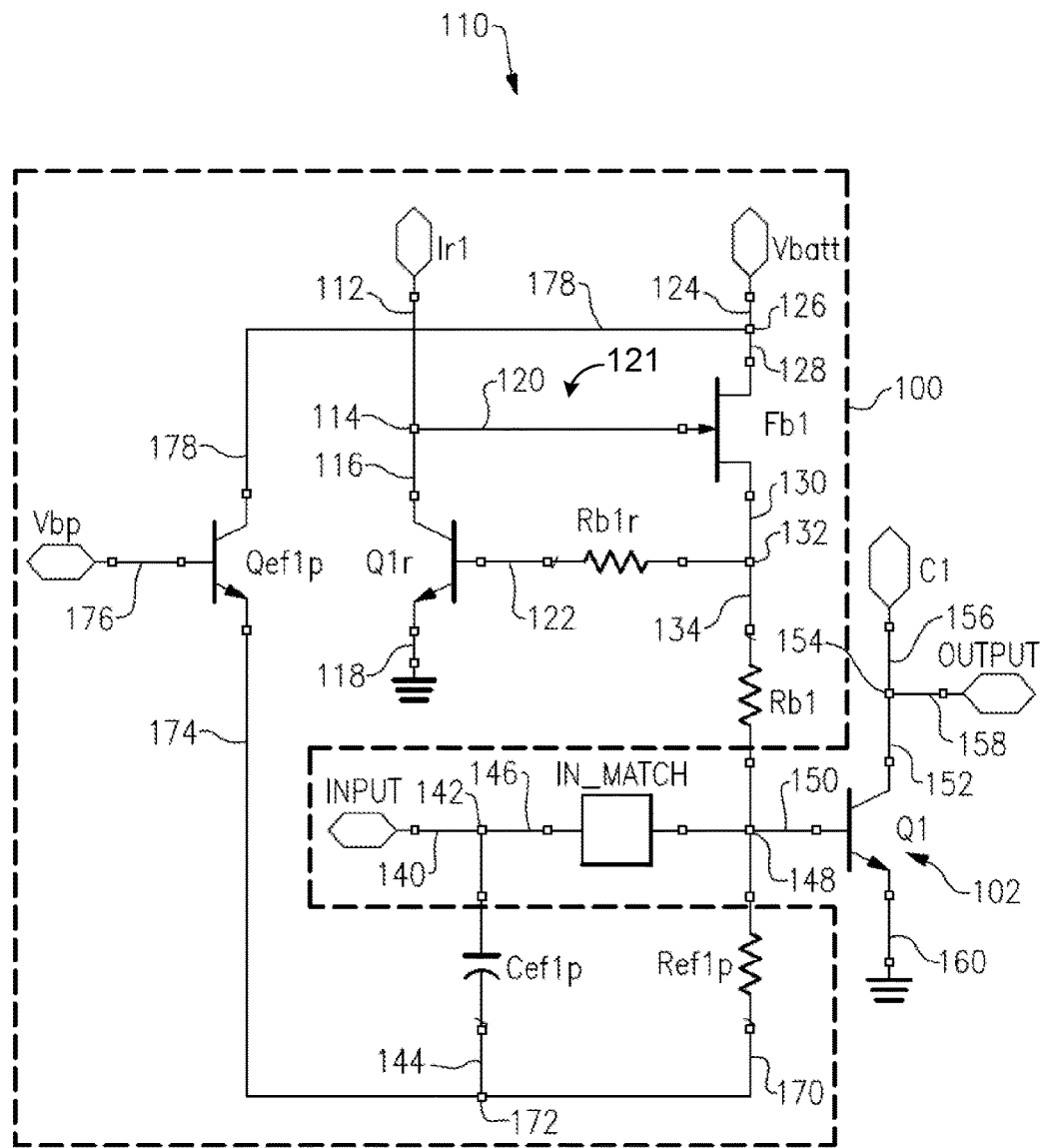
FIG. 4 shows an example of a biasing configuration where a bias circuit can provide varying biasing signal to an amplifying transistor so as to yield desirable effects such as improved linearity.

FIG. 4 shows an example of a biasing configuration 110 where a bias circuit 100 can provide varying biasing signal to an amplifying transistor Q1, so as to yield desirable effects such as improved linearity. In the example of FIG. 4, an RF signal is shown to be received by the base of an amplifying transistor 102 (Q1) (e.g., a BJT such as an HBT) through an input port (Input), path 140, node 142, path 146, an input matching network (In_match), node 148, and path 150. The amplified RF signal is shown to be provided to an output port (Output) through the collector of the transistor Q1, path 152, node 154, and path 158. Supply voltage for the transistor Q1 can be provided to the collector node 154 of Q1 from a supply node (C1), through path 156. The emitter of the transistor Q1 is shown to be coupled to ground through path 160.

In the example of FIG. 4, the bias circuit 100 can include a current mirror arrangement 121 similar to the current mirror arrangement 21 of the bias circuit 12 of FIG. 2. More particularly, a current mirror having a reference side and a battery supply side can be coupled to the base node 148 of the amplifying transistor Q1. The reference side is shown to include a path between a reference current node (Ir1) and ground through path 112, node 114, path 116, a BJT (Q1r) (e.g., an HBT), and path 118. The battery supply side is shown to include a path between a battery voltage node (Vbatt) and the base node 148 through path 124, node 126, path 128, a field-effect transistor (Fb1), path 130, node 132, path 134, and a base resistance Rb1. The gate of the FET Fb1 is shown to be coupled to the node 114 (and thus the collector of Q1r) through path 120. The base of the HBT Q1r is shown to be coupled to the node 132 (and thus the source of Fb1) through path 122 that includes a resistance Rb1r.

In the example of FIG. 4, the bias circuit 100 can further include an emitter follower that couples the battery voltage node (Vbatt) and the base node 148 of the amplifying transistor Q1. Such a coupling path can include a BJT Qef1p (e.g., an HBT), with its collector being coupled to the battery voltage node (Vbatt) through path 124, node 126, and path 178. The base of the BJT Qef1p is shown to be coupled to a DC voltage node (Vbp) through path 176. The emitter of the BJT Qef1p is shown to be coupled to the base node 148 of the amplifying transistor Q1 through path 174, node 172, path 170, and a resistance Ref1p. The emitter of the BJT Qef1p is also shown to be coupled to the input node 142 through path 144 that includes a capacitance Cef1p.

The example bias circuit 100 described in reference to FIG. 4 has been shown in simulation and in measurements to lower ACLR (adjacent-channel leakage ratio) and increase linear range of the output power (Pout), thereby increasing maximum linear power added efficiency (PAE). As described in reference to FIG. 4, the bias circuit 100 includes a parallel driver stage bias emitter follower (Qef1p). Although described in the context of a driver stage, it will be understood that one or more features of the present disclosure can also be implemented in connection with other PA stages.

In an example application involving an HBT RF power amplifier with a plurality of stages, it is noted that a relatively low impedance/low base bias (e.g., class AB) can be used in a final stage, while a relatively high base bias resistance can be used in a driver stage. The low final stage base bias can reduce the overall PA current, but can result in final stage gain expansion vs. RF power. The higher driver stage base bias and resistance can cause gain droop in the driver stage, compensating the final stage expansion. Overall flat phase and gain can be achieved, for example, up to compression of the final stage, with appropriate choice of driver and final stage base bias and impedance. Flat gain and phase vs. RF power (e.g., over the modulation bandwidth) can contribute to low ACLR. The final stage gain compression, however typically can be somewhat soft. For example, a 0.25 dB increase in 0.5 dB gain compression can increase linear Pout by about 0.25 dB and increase maximum linear PAE by about 1%. Both low ACLR and high PAE are increasingly valued.

As described in reference to FIG. 4, the RF signal at the input node (142) is capacitively coupled to the emitter of Qef1p (through Cef1p, path 144, node 172, and path 174). The emitter of Qef1p is also DC connected by a resistor (Ref1p) to the base node 148 of the driver stage Q1 (through path 174, node 172, path 170, and Ref1p) so as to be generally parallel with the reference path between Ir1 and ground. In some embodiments, the DC voltage (Vbp) applied to the base of Qef1p can be selected such that Qef1p is biased just below turn-on with low RF power (e.g., at the RF signal at the input node 142).

In the example of FIG. 4, and in an example context of a driver stage, positive RF peaks can be clamped by the base/emitter junction of the driver stage, resulting in the average driver stage base voltage decreasing with increasing RF power. As described herein, the driver stage gain and phase droop can compensate for the final stage expansion.

Negative RF peaks can be clamped by the emitter of Qef1p. In some embodiments, the average Qef1p emitter voltage can rise with increasing RF power. At some RF input power Qef1p can start to conduct, thereby increasing the driver stage base bias current through Ref1p. Accordingly, the stage's RF gain and phase droop can reverse and begin to expand. Vbp can be adjusted so the driver stage gain reversal substantially coincides with the final stage compression. For example, the foregoing overall PA 0.5 dB gain compression can be pushed out. The overall phase compression of the PA can also be pushed out.

Although the foregoing examples related to FIG. 4 are described in the context of a driver stage, it will be understood that one or more features as described herein can also be implemented in one or more other stages of a power amplifier.

As described herein in reference to FIG. 4, the path that includes Qef1p and Ref1p can be configured to be generally parallel with a conventional bias circuit. For example, such a conventional bias circuit can be a typical emitter follower bias circuit or a typical BiFET follower circuit. The latter can be configured to allow for low Vbatt compatibility. In the example of FIG. 4, the bias circuit 100 can be configured to obtain one or more desirable improvements in performance. For example, some or all of the normal bias current (Ib1), normal bias resistance (Rb1), Ref1p, Vbp, and RF coupling (e.g., Cef1p) can be independently set to optimize or improve performance of gain and phase vs. RF power. In some embodiments, Ib1 and Vbp can be controlled independently (e.g., through MIPI), and the foregoing improvement in performance can be extended to lower average power. In some embodiments, separate temperature compensation can also be applied to Vbp.

Figure 5:
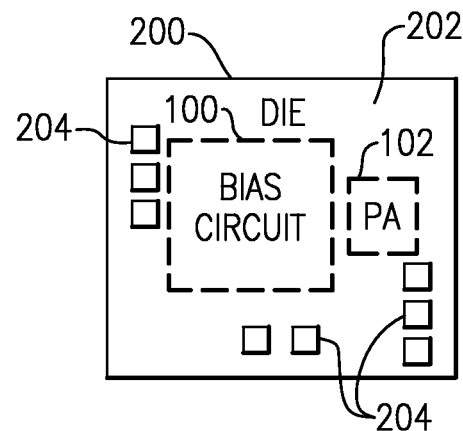
FIG. 5 depicts a die that can include a bias circuit having one or more features as described herein.

FIG. 5 schematically depicts a die 200 that can include a bias circuit 100 having one or more features as described herein. The semiconductor die 200 can include a substrate 202. In some embodiments, a power amplifier (PA) circuit 102 (e.g., HBT) can also be implemented on the substrate 202. For example, and in the context of an HBT PA, at least HBTs (e.g., Q1r and Qef1p of FIG. 4) of the bias circuit 100 can be formed on the same substrate 202. A plurality of connection pads 204 can also be formed on the substrate 202 to provide, for example, power and signals for the PA circuit 102 and the bias circuit 100.

Figure 6:
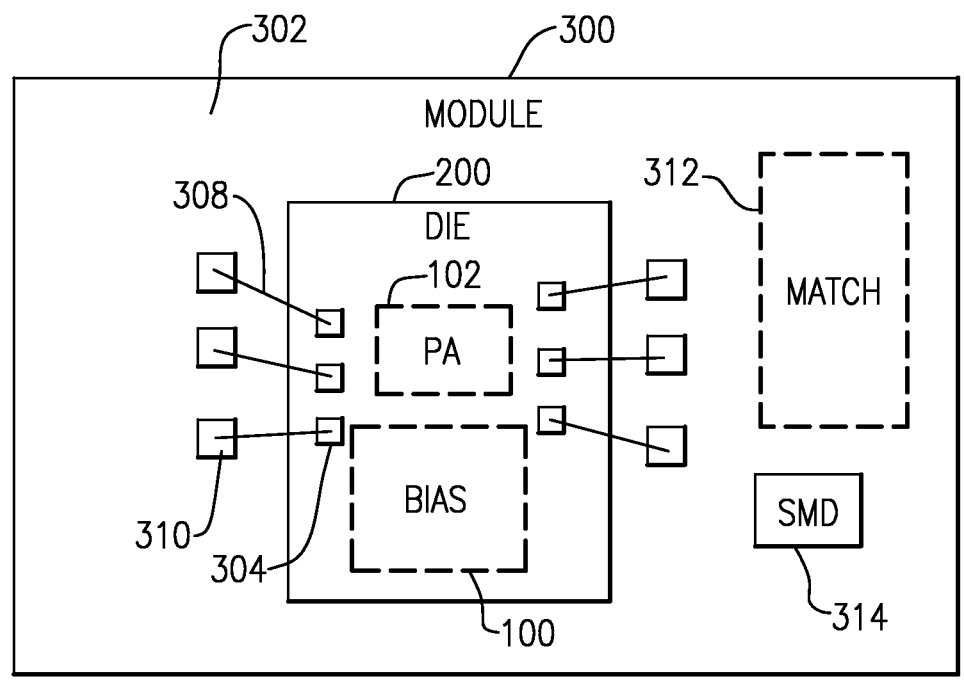
FIG. 6 depicts a module having one or more features as described herein.

In some implementations, one or more features described herein can be included in a module. FIG. 6 schematically depicts an example module 300 having a packaging substrate 302 that is configured to receive a plurality of components. In some embodiments, such components can include a die 200 having one or more featured as described herein. For example, the die 200 can include a PA circuit 102 and a bias circuit 100. A plurality of connection pads 304 can facilitate electrical connections such as wirebonds 308 to connection pads 310 on the substrate 302 to facilitate passing of various power and signals to and from the die 200.

In some embodiments, other components can be mounted on or formed on the packaging substrate 302. For example, one or more surface mount devices (SMDs) (314) and one or more matching networks (322) can be implemented. In some embodiments, the packaging substrate 302 can include a laminate substrate.

In some embodiments, the module 300 can also include one or more packaging structures to, for example, provide protection and facilitate easier handling of the module 300. Such a packaging structure can include an overmold formed over the packaging substrate 302 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 7:
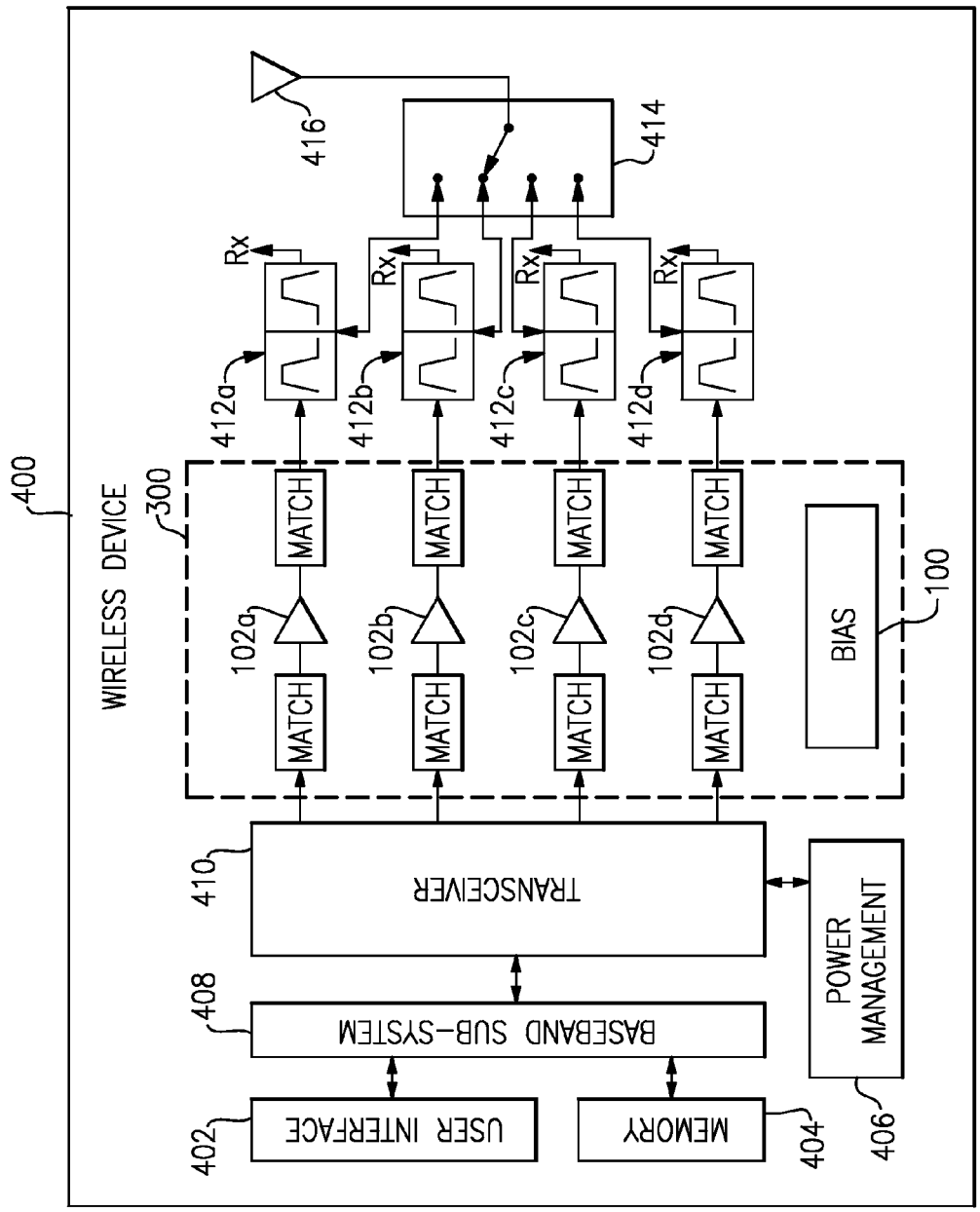
FIG. 7 depicts a wireless device having one or more features described herein.

FIG. 7 schematically depicts an example wireless device 400 having one or more advantageous features described herein. One or more PAs 102 as described herein are shown to be biased by one or more bias circuits 100 having one or more features as described herein. In embodiments where the PAs 102 and their bias circuit(s) 100 are packaged into a module, such a module can be represented by a dashed box 300. In some embodiments, the module 300 can include at least some of input and output matching circuits.

The PAs 102 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 102 are shown to be matched and routed to an antenna 416 via their respective duplexers 412a-412d and a band-selection switch 414. The band-selection switch 414 can be configured to allow selection of, for example, an operating band or an operating mode. In some embodiments, each duplexer 412 can allow transmit and receive operations to be performed simultaneously using a common antenna (e.g., 416). In FIG. 7, received signals are shown to be routed to "Rx" paths (not shown) that can include, for example, a low-noise amplifier (LNA).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A bias circuit for a power amplifier (PA), the bias circuit comprising:
   a first bias path implemented to couple a base node of an amplifying transistor and a supply node, the first bias path configured to provide a base bias current to the base node, the first bias path including a field-effect transistor (FET) having a source, a drain, and a gate, the source coupled to the supply node, the drain coupled to the base node; and
   a second bias path implemented to be electrically parallel with the first bias path between the base node and the supply node, the second bias path configured to provide an additional base bias current to the base node under a selected condition, the second bias path including an emitter follower having a collector, an emitter, and a base, the collector coupled to the supply node, the emitter coupled to the base node.

2. The bias circuit of claim 1 wherein the amplifying transistor is part of a driver stage of the PA.

3. The bias circuit of claim 1 wherein the base of the emitter follower is coupled to a node having a DC voltage.

4. The bias circuit of claim 3 wherein the emitter follower is configured so that its average emitter voltage increases with an increase in RF power at an RF input node.

5. The bias circuit of claim 4 wherein the emitter follower is further configured to conduct at the selected condition to thereby provide the additional base bias current to the base node.

6. The bias circuit of claim 5 wherein the selected condition includes a selected level of increased RF power at the input node.

7. The bias circuit of claim 6 wherein the selected level of increased RF power resulting in the conduction through the emitter follower to provide the additional base bias current to the base node to thereby result in a reversal of gain and phase droop associated with the driver stage.

8. The bias circuit of claim 7 wherein the DC voltage is selected such that the reversal of gain and phase droop of the driver stage substantially coincides with a final stage compression.

9. The bias circuit of claim 8 wherein the DC voltage is selected such that the emitter follower is biased just below a turn-on level with a selected low RF power at the input node.

10. The bias circuit of claim 6 wherein the second bias path further includes a resistance between the emitter of the emitter follower and the base node.

11. The bias circuit of claim 10 further comprising a capacitance that couples the emitter of the emitter follower and the input node.

12. The bias circuit of claim 1 wherein the first bias path further includes a resistance between the drain of the FET and the base node.

13. The bias circuit of claim 12 wherein the first bias path is part of a current mirror.

14. The bias circuit of claim 13 wherein the current mirror includes a reference side coupled to the first bias path, the reference side including a bipolar-junction transistor (BJT) having a collector, an emitter, and a base, the collector coupled to a reference current node, the emitter coupled to a ground.

15. The bias circuit of claim 14 wherein the reference current node is coupled to the gate of the FET of the first bias path, and the base of the BJT of the reference side is coupled to a node between the source of the FET and the resistance of the first bias path.

16. The bias circuit of claim 15 wherein each of the BJT of the reference side of the current mirror, the emitter follower of the second bias path, and the amplifying transistor is a heterojunction bipolar transistor (HBT).

17. A method for biasing a power amplifier (PA), the method comprising:
   providing a base bias current to a base node of an amplifying transistor through a first bias path that couples the base node and a supply node, the first bias path including a field-effect transistor (FET) having a source, a drain, and a gate, the source coupled to the supply node, the drain coupled to the base node;
   generating an additional base bias current under a selected condition; and
   delivering the additional base bias current to the base node through a second bias path that is electrically parallel with the first bias path between the base node and the supply node, the second bias path including an emitter follower having a collector, an emitter, and a base, the collector coupled to the supply node, the emitter coupled to the base node.

18. A power amplifier module comprising:
   a packaging substrate configured to receive a plurality of components;

a power amplifier (PA) circuit formed on a die that is mounted on the packaging substrate, the PA circuit including an amplifying transistor, the amplifying transistor having a base, a collector, and an emitter, the base coupled to a base node for receiving a radio-frequency (RF) signal;

a bias circuit coupled with the PA circuit and configured to bias the base of the amplifying transistor, the bias circuit including a first bias path configured to couple the base node and a supply node, the first bias path further configured to provide a base bias current to the base node, the bias circuit further including a second bias path configured to be electrically parallel with the first bias path between the base node and the supply node, the second bias path further configured to provide an additional base bias current to the base node under a selected condition, the first bias path including a field-effect transistor (FET) having a source, a drain, and a gate, the source coupled to the supply node, the drain coupled to the base node, the second bias path including an emitter follower having a collector, an emitter, and a base, the collector coupled to the supply node, the emitter coupled to the base node; and a plurality of connectors configured to provide electrical connections between the PA circuit, the bias circuit, and the packaging substrate.

\* \* \* \* \*